United States Patent
Sanford (12) 
(10) Patent No.: US 6,248,509 B1
(45) Date of Patent: Jun. 19, 2001

(54) MASKLESS PHOTORESIST EXPOSURE SYSTEM USING MEMS DEVICES

(76) Inventor: James E. Sanford, 7051 S. Taylor Dr., Tempe, AZ (US) 85283

(*) Notice: Subject to any disclaimer, the term of this patent is extended or adjusted under 35 U.S.C. 154(b) by 0 days.

(21) Appl. No.: 09/362,276

(22) Filed: Jul. 27, 1999

(51) Int. Cl.$^7$ ................................................ G03B 27/42
(52) U.S. Cl. ........................................................ 430/396
(58) Field of Search .................................. 430/313, 269, 430/396; 355/53, 71

(56) References Cited

U.S. PATENT DOCUMENTS

| | | | |
|---|---|---|---|
| 4,283,259 | 8/1981 | Melcher et al. | 204/129.3 |
| 5,109,149 | 4/1992 | Leung | 219/121.69 |
| 5,298,939 | * 3/1994 | Swanson et al. | 355/53 |
| 5,451,489 | 9/1995 | Leedy | 430/313 |
| 5,459,098 | 10/1995 | Maya | 437/173 |
| 5,607,601 | 3/1997 | Loper et al. | 216/63 |
| 5,654,127 | 8/1997 | Leedy | 430/315 |
| 5,691,541 | 11/1997 | Ceglio et al. | 250/492.1 |
| 5,781,331 | 7/1998 | Carr et al. | 359/288 |
| 5,808,384 | 9/1998 | Tabat et al. | 310/40 |
| 5,835,195 | * 11/1998 | Gibson | 355/53 |

* cited by examiner

Primary Examiner—Thorl Chea
(74) Attorney, Agent, or Firm—Cahill, Sutton & Thomas P.L.C.

(57) ABSTRACT

A maskless exposure system for selectively exposing a photosensitive work surface, such as a photoresist layer, includes a semiconductor substrate having an elongated aperture. A series of shutters and associated guides are formed upon the substrate using conventional wafer processing methods. The shutters move between a first position covering the aperture and a second position exposing the aperture. A corresponding series of computer-controlled actuators, in the form of electromagnetic coils, cooperate with the shutters for selectively sliding each shutter between its first and second positions. A light beam is directed toward the aperture, and the shutters create a patterned light beam exiting the aperture. A computer-controlled stepper is synchronized with the shutter actuators and adjusts the relationship between the patterned light beam and the photosensitive work surface to direct the patterned light beam at different portions of the work material.

10 Claims, 5 Drawing Sheets

MASKLESS PHOTORESIST EXPOSURE SYSTEM USING MEMS DEVICES

BACKGROUND OF THE INVENTION

1. Field of the Invention

The present invention relates generally to the fields of image transfer and the photolithographic transfer of images to a semiconductor wafer, printed circuit board or other substrate, and more particularly, to an apparatus and method for selectively exposing a photosensitive layer of material to a patterned source of light without the need for a mask.

2. Description of the Relevant Art

Image transfer of complex patterns onto substrates such as semiconductor wafers, printed circuit boards, flat panel displays, and the like commonly employ the use of a photolithographic apparatus containing a light source, a system of lenses and/or mirrors and a photomask, mask or reticle. In common step-and-repeat, or step-and-scan systems, light moves from a light source, through a lens/mirror assembly, and through a patterned mask onto the substrate which is covered with a photosensitive polymer resist. The mask is a two dimensional stencil of the pattern to be transferred. Often, thirty or more different patterns, or layers, are transferred to a given substrate during the manufacturing process, requiring a different mask for each such layer. The mask manufacturing process has proven to be a costly and time-consuming process. The mask itself is easily damaged during everyday handling; accordingly, it is common to produce duplicate masks in order to replace masks that become damaged. Elimination of the various masks would save time and money in the manufacturing process.

The advantages inherent in eliminating the need for such exposure masks has long been recognized, and those skilled in the art have explored mask free lithography in depth. Current directwrite methods are known, such as laser, electron or ion beam lithography, wherein a fine beam of light is selectively steered to shine on each point of the photosensitive film that needs to be exposed. For example, in U.S. Pat. No. 5,451,489 to Leedy, an electron beam is used to selectively expose a photoresist layer on a semiconductor wafer without the use of a mask. Similarly, in U.S. Pat. No. 5,109,149 to Leung, a laser beam is used in conjunction with a polygonal mirror, a beam expander, and a lens to selectively direct light onto the surface of a wafer mounted on an X-Y axis motorized table. However, these direct-write techniques have been proven to be too slow for economic commercial use.

In U.S. Pat. No. 5,691,541 to Ceglio, et al., a lithography system is described wherein a programmable array of "light switches", in the form of an array of digital micro-mirror devices, is provided to control the passage of light from a source to a photosensitive layer to be exposed. Each micromirror is either deflected through an angle to form a dark portion of the pattern, or undeflected to form a bright portion of the pattern. However, the device described by Ceglio, et al. is dependent upon the proper alignment of many small reflecting mirrors in order to reflect the desired image to the substrate. Reflective aberrations and mirror mis-alignment cause inaccuracies in the image that is projected onto the substrate.

In U.S. Pat. No. 5,781,331 to Carr, et al., an optical micro-shutter array is described that can be produced using known semiconductor fabrication processes. The disclosed optical shutter includes an aperture plate positioned in a light path, the aperture plate having an array of apertures formed therein. A series of microcantilevers are used to selectively cover the array of apertures, each microcantilever being associated with one of the apertures. Carr, et al. describe such microcantilevers as preferably being formed of two layers of material having different thermal coefficients of expansion, and preferably being thermally-actuated, although Carr, et al. also state that piezoelectric and electrostatic-originating forces may also be employed. When a microcantilever is heated by passing an electrical current through an associated resistor, the microcantilever curls away from the associated aperture, thereby allowing light to pass through such aperture. One disadvantage of using such microcantilevers is that their up and down curling/flexing motion tends to cause unwanted interference between two adjacent microcantilevers; if a first microcantilever is trying to curl up away from its aperture, and a second adjacent microcantilever is trying to move down toward its adjacent aperture, then the two microcantilevers may contact each other.

U.S. Pat. No. 5,808,384 to Tabat describes a micromechanical actuator that can be formed on substrates using lithographic processing techniques. Tabat describes such devices as being useful for, among other things, forming optical switches. A plunger having two magnetic heads is supported within a gap of a magnetic core to which an electrical coil is coupled. A pair of springs bias the plunger to a central position. The application of electrical current to the electrical coil moves the plunger back and forth in a linear movement depending upon the direction of current flow. However, the necessity of having the actuators pass through the core of the electrical coil places restrictions on how close two or more of such actuators can be positioned relative to each other. Moreover, the need to form spring-like biasing members within the substrate further complicates the fabrication of such devices.

Accordingly, it is an object of the present invention to provide a maskless photoresist exposure system which eliminates the need for masks in order to selectively expose photosensitive layers applied to semiconductor wafers, printed circuit boards, or other substrates.

Another object of the present invention is to provide such a maskless photoresist exposure system capable of using a conventional photolithographic light source and avoiding the need for lasers, electron beams, or ion beams.

Still another object of the present invention is to provide such a maskless photoresist exposure system which operates quickly enough to prove economically feasible for commercial use.

A further object of the present invention is to provide such a maskless photoresist exposure system which avoids the need for precise alignment of small mirrors in order to produce a patterned light image.

A still further object of the present invention is to provide such a maskless photoresist exposure system which includes a series of optical shutters that can be disposed closely proximate one another to form adjacent pixels of light, yet wherein movement of one such shutter does not interfere with movement of shutters adjacent thereto.

A yet further object of the present invention is to provide such a maskless photoresist exposure system wherein the aforementioned series of optical shutters can themselves be formed using known photolithographic semiconductor processing techniques.

Yet another object of the present invention is to provide such a maskless photoresist exposure system wherein the aforementioned series of optical shutters need not themselves pass through the core of an electrical coil.

Still another object of the present invention is to provide a method of performing mask free photolithography.

An additional object of the present invention is to provide a novel method of forming an electrical coil, suitable for use in forming an electromechanical actuator, on a semiconductor substrate using known semiconductor wafer processing techniques.

These and other objects of the present invention will become more apparent to those skilled in the art as the description of the present invention proceeds.

SUMMARY OF THE INVENTION

Briefly described, and in accordance with the preferred embodiment thereof, the present invention relates to a maskless exposure system for selectively exposing a photosensitive work surface of a work material to light. Such photosensitive work surface could be a photosensitive film applied over the work material, such as a photoresist layer; alternatively, the work material may itself be photosensitive, such as photo-imagable glass, in which case the photosensitive work surface is merely an outer surface of the work material. The maskless exposure system of the present invention includes a generally planar substrate having an elongated aperture formed therein. A light beam from a source of light having a desired wavelength is directed generally toward the elongated aperture of the aforementioned substrate. The aforementioned source of light may include a projection system of lenses and/or mirrors to focus the beam of light toward the elongated aperture of the substrate. A plurality of shutter elements are formed upon the substrate generally parallel thereto and movably supported thereon. Each of the shutter elements is adapted to move between a first position covering a portion of the elongated aperture, and thereby preventing the passage of light through such portion, and a second position exposing a portion of the elongated aperture for allowing the passage of light therethrough. In order to control movement of the various shutter elements, a series of actuators are also included; each actuator cooperates with one of the shutter elements for selectively moving it between its first and second positions. These actuators are preferably computer-controlled so that desired movements of the shutter elements can be programmed. The combination of the covered and exposed portions of the elongated aperture creates a patterned light beam exiting the elongated aperture of said substrate.

The material bearing the photosensitive work surface is supported by a holder. A stepper device is provided for adjusting the relationship between the patterned light beam exiting the elongated aperture of the substrate and the work material holder in order to direct the patterned light beam at different portions of the work material. This stepper is again preferably controlled by a computer for programming movements of the patterned light beam relative to the work material, and to synchronize the operation of the shutter elements with the operation of the stepper. In one embodiment of the present invention, the stepper is a scanning mirror which is disposed at various angles to reflect the patterned light beam onto different portions of the work material; in an alternate embodiment, the patterned light beam is aimed directly onto the work material, and the stepper is an indexing system for physically shifting the work material holder until all portions of the work material have been exposed to the patterned beam.

Preferably, the aforementioned substrate in which the aperture is formed is constructed from a semiconductor material such as silicon, and the series of shutter elements are also formed of semiconductor material, using conventional semiconductor wafer processing techniques. In this regard, the semiconductor material forming such shutter elements can be semiconductor material that was initially deposited upon the substrate using known chemical vapor deposition techniques.

Ideally, each of the shutter elements slides in a linear motion between its first position covering a portion of the aperture, and its second position exposing such portion of the aperture. To facilitate such sliding motion, guides can be formed upon the substrate. Such guides can be disposed below and/or extend around each shutter element for guiding the movement thereof.

In those instances wherein two adjacent shutter elements both assume their first positions for blocking the passage of light through the aperture, it is desired that no light gap exist between the two adjacent shutter elements. Accordingly, abutting side edges of two adjacent shutter elements preferably extend closely proximate one another to avoid creation of any light gaps therebetween. In order to help position the abutting side edges of adjacent shutter elements as close together as possible, Applicant has found it to be helpful to position successive shutter elements on opposite sides of the elongated aperture.

In the preferred embodiment of the present invention, the shutter elements are actuated electromagnetically. In this regard, each shutter element includes a small permanent magnet affixed to an end of the shutter element, and each actuator includes an electromagnet in the form of a coiled electrical conductor for repelling or attracting the permanent magnet formed upon the related shutter element. The electrical coil extends along a longitudinal axis that is generally parallel to, and coaxial with, the axis of linear movement of the shutter element. To prevent one such coil from influencing a neighboring shutter element, magnetic shielding is preferably interposed between adjacent actuators.

The present invention also relates to Applicant's method for selectively exposing a light pattern to a photosensitive work surface of a work material. In practicing such method, a generally planar substrate is provided having an elongated aperture formed therein. A beam of light is directed generally toward the elongated aperture of the substrate. A series of shutter elements are supported upon the substrate, each of the shutter elements being movable between a first position covering a portion of the elongated aperture and a second position exposing a portion of the elongated aperture. These shutter elements extend generally parallel to the plane of the substrate whether in the aforementioned first position or second position. Each of the shutter elements is moved to either its first position or its second position to selectively block or pass portions of the beam of light in order to create a patterned light beam that exits through the elongated aperture of the substrate; preferably, each of the shutter elements moves between its first and second positions by a sliding motion along a linear path. The resulting patterned light beam is then directed toward a first portion of the photosensitive work surface of the work material. After selectively exposing the first portion of the photosensitive work surface, the step of moving the shutter elements is repeated to create a new patterned light beam that is directed at a second portion of the photosensitive work surface of the work material. This process can be repeated until substantially all portions of the photosensitive work surface have selectively been exposed to an appropriately patterned beam of light.

Preferably, the method described above includes the step of forming the substrate from a wafer made of a semiconductor material. The step of forming the series of shutter elements preferably includes the step of forming a first sacrificial layer of a material upon a surface of the substrate; this first sacrificial layer is an oxide or nitride of the semiconductor material that forms the substrate. Next, a first layer of semiconductor material is deposited upon the first sacrificial layer, and this first layer is then patterned to form the shutter elements. The first sacrificial layer underlying the patterned deposited first layer of semiconductor material is then etched to allow the shutter elements to move relative to the substrate.

If desired, the method of the present invention may also include the step of forming a second sacrificial layer of material upon the surface of the substrate overlying the deposited first layer of semiconductor material; this second sacrificial layer may also be an oxide or nitride of the semiconductor material. A second layer of semiconductor material is then deposited upon the second sacrificial layer, and is patterned to form guide elements that bridge across the shutter elements. The second sacrificial layer that underlies the patterned deposited second layer of semiconductor material is then etched away for allowing the shutter elements to slide within the guide elements. Each shutter element is preferably positioned within at least one surrounding guide for guiding sliding movements of each such shutter element. Ideally, successive shutter elements are positioned on alternating sides of the elongated aperture.

In order to move the shutter elements, the method of the present invention preferably includes the steps of providing a small permanent magnet on each shutter element, forming an electromagnet, including an electrical coil through which electrical current can flow, proximate each shutter element, and controlling the direction of current flow through each such electrical coil in order to repel or attract each of the shutter elements.

The electrical coils described in the preceding paragraph can advantageously be formed by the method of depositing a first layer of metal upon the semiconductor substrate, and patterning the deposited first layer of metal to form a number of lower rungs of the electrical coil. A first insulative layer of material is then formed over the substrate and above the patterned deposited first layer of metal. A layer of magnetic material is then formed above the first insulative layer and extending across the plurality of lower rungs of the electrical coil. A second insulative layer of material is formed over the substrate above both the first insulative layer and the layer of magnetic material. Holes are then etched through the first and second insulative layers above the opposing first and second ends of the lower rungs to expose the ends of such lower rungs. A second metal layer is deposited upon the substrate over the second insulative layer and within the etched holes that expose the ends of the lower rungs. The second metal layer is patterned to connect the second end of each lower rung to the first end of a next succeeding lower rung to form the electrical coil. A third insulative layer of material is then formed over the substrate, extending above the electrical coils to insulate the second metal layer portion of the electrical coils. Preferably, magnetic shielding material is deposited between, but spaced apart from, adjacent electrical coils to isolate the electromagnetic field in one coil from adjacent coils.

Detailed Description of the Preferred Embodiments

Figure 1:
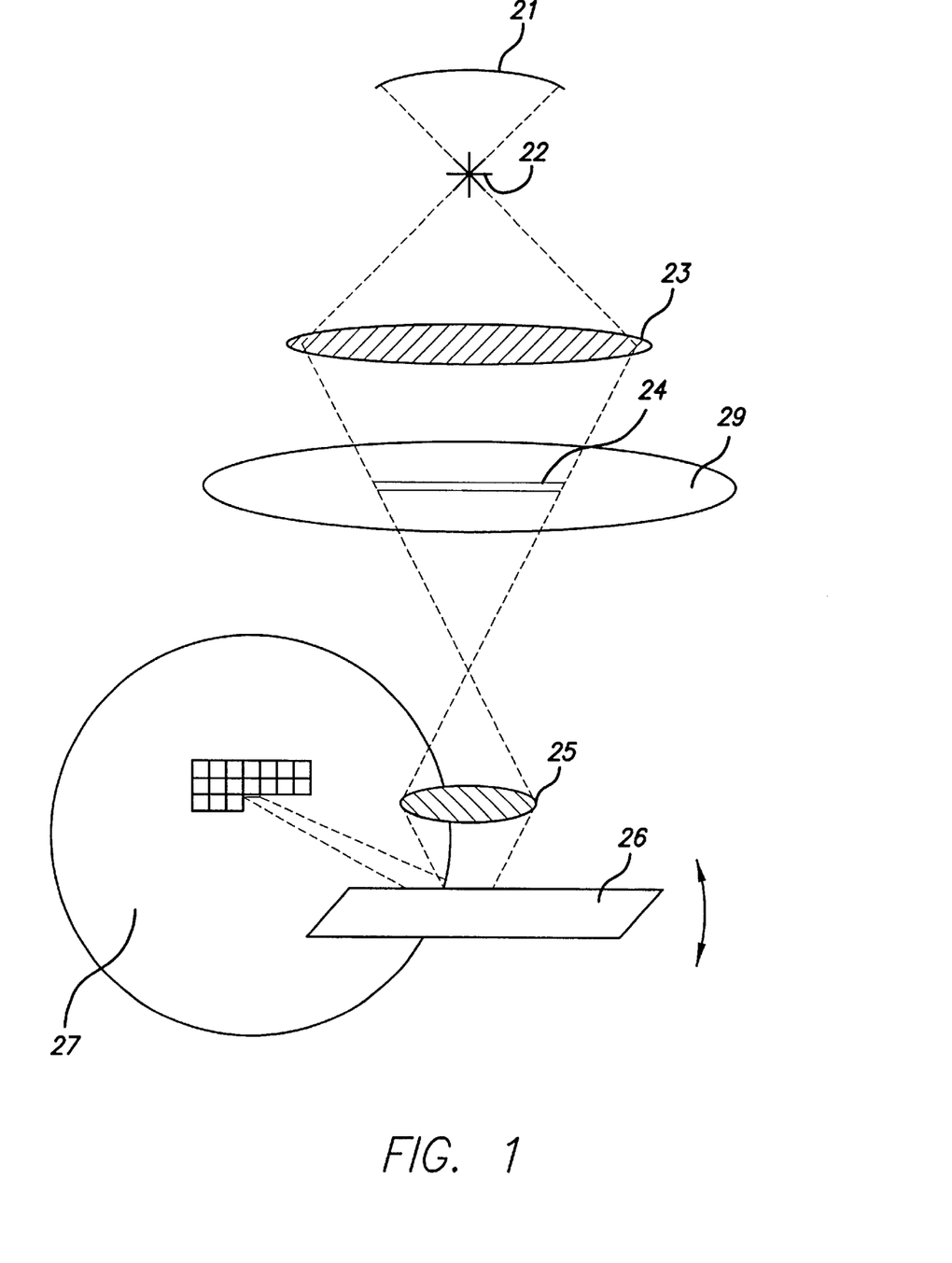
FIG. 1 is a schematic view of an optical projection system using the apparatus and method of the present invention.

As indicated in FIG. 1, an optical projection system using the present invention includes a mirror 21 and a light source 22. Light source 22 provides light of a desired wavelength suitable for exposing a photosensitive coating or other work surface of a work material. The light beam formed by light source 22 and mirror 21 is directed through a condenser lens 23 which focuses the light through a narrow slit aperture assembly 24 formed upon a substrate 29. In this sense, light source 22, mirror 21, and condenser 23 collectively form a source of a light beam that is directed toward slit aperture assembly 24. In a manner to be described in greater detail below, slit aperture assembly 24 has the ability to selectively block portions, or pixels, of the light beam transmitted by condenser lens 23. The patterned light beam passing through slit aperture assembly 24 is intercepted by a reduction lens 25 used to demagnify the projected image to a desired pixel size. A scanning mirror 26 then scans the projected image across a portion of a substrate 27 to be exposed, for example, a semiconductor wafer bearing a photoresist coating, or a photosensitive substrate. Substrate 27 thereby represents some form of work material that has a photosensitive work surface. Substrate 27 is supported by a precisely controlled indexed stage (not shown) which can be moved in incremental steps along an x-axis and y-axis to allow the desired portions of substrate 27 to be exposed by correspondingly patterned beams of light. The patterned light beam produced by slit aperture assembly 24 can be stepped across the photosensitive work surface of substrate 27, either by holding substrate 27 fixed while moving scanning mirror 26, by holding -coding mirror 26 fixed while moving the indexed stage that supports the work material, or by combined motion of both scanning mirror 26 and the indexed stage. In either of these cases, the relationship between the patterned light beam exiting the aperture assembly 24 and the work material support is adjusted in order to direct the patterned light beam at different portions of the photosensitive work surface of the work material.

Light source 22 may produce light of any desired wavelength ranging from visible light to wavelengths down to 5 nm, or soft X-rays. The lens system, including condenser lens 23 and demagnifying lens 25, must be adjusted to support the desired wavelength of light. Transmissive optics of current step-and-repeat optical projection systems can support wavelengths down to 193 nm. Future transmissive lens materials such as CaF are being developed for even shorter wavelengths. Reflective optics would need to be used for very short wavelengths such as extreme ultraviolet (EUV) wavelengths of 5 to 20 nm. As in prior art step-and-repeat optical projections systems, color filters (not shown) may be used to allow only desired wavelengths of light to pass through the optics.

Figure 2:
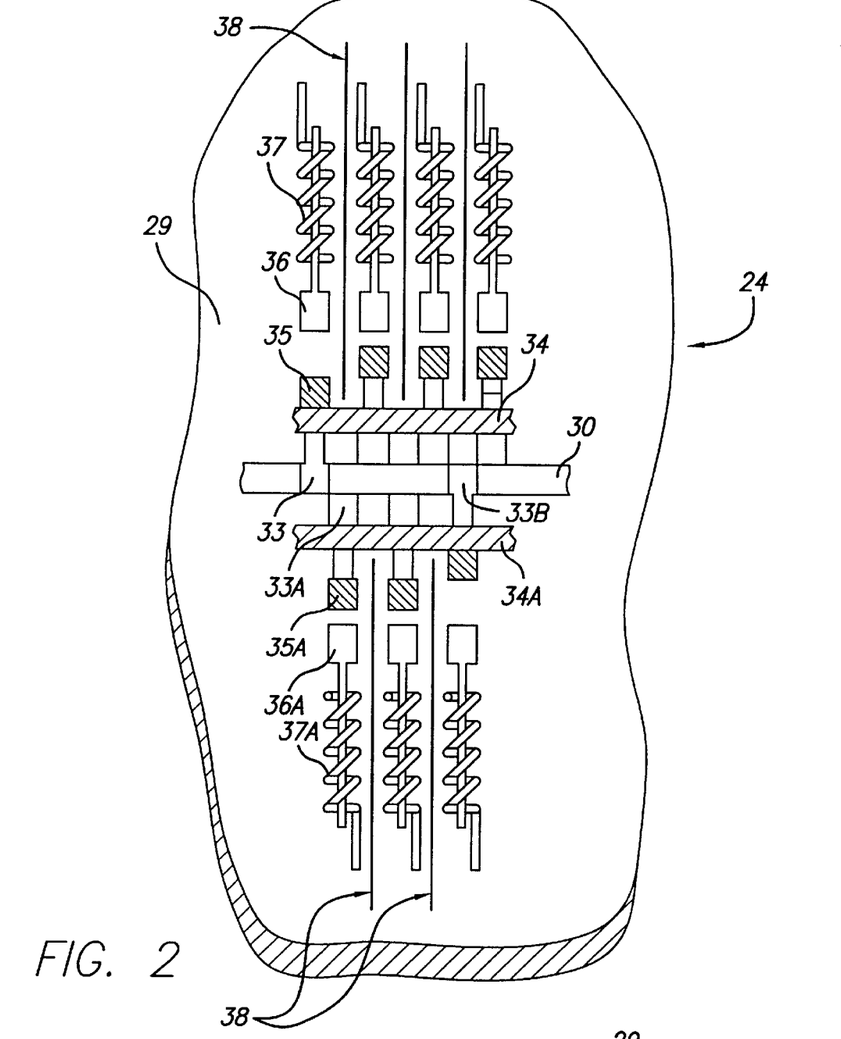
FIG. 2 is a top view of a slit aperture formed in a substrate, and including a series of sliding shutter elements used to selectively pattern the light beam passing through the slit aperture.

The preferred embodiment of slit aperture assembly 24 is shown in FIG. 2. Substrate 29 is preferably in the form of a generally planar semiconductor wafer made from silicon or a similar material. Substrate 29 has a long, narrow opening, or aperture 30, etched or otherwise formed through it. A series of micro electromechanical system, or MEMS, shutters, including those designated by reference numerals 33, 33A, and 33B, are placed alternately on either side of slit aperture 30, and are movably supported upon substrate 29 in such a way as to selectively block certain portions of aperture 30. Each of the shutters, including shutters 33, 33A, and 33B, extends generally parallel to the plane of substrate 29, and each is free to move back and forth, with a generally linear, sliding motion, between first and second end positions, to alternately cover or expose a selected portion of elongated aperture 30. For example, as shown in FIG. 2, shutter elements 33 and 33B are each extended to their first positions for covering a portion of elongated aperture 30 to preventing the passage of light therethrough, while shutter element 33A is retracted to its second position for exposing a portion of elongated aperture 30 for allowing the passage of light through such portion. In this manner, the series of shutter elements, including 33, 33A, and 33B, can be used to create a patterned light beam that exits through elongated aperture 30 of substrate 29.

Still referring to FIG. 2, the shutter elements disposed above aperture 30, including shutter element 33, are held to the surface of substrate 29 by a silicon bridge structure 34. Likewise, the shutter elements disposed below aperture 30, including shutter elements 33A and 33B, are held to the surface of substrate 29 by silicon bridge structure 34A. A magnetic material 35 with a permanent polarity (i.e., a permanent magnet) is deposited on one end of shutter element 33 and is influenced by an adjacent magnetic material 36 which extends within a small electrical coil structure 37. Magnetic material 36 and electrical coil 37 constitute an electromagnet for selectively repelling or attracting permanent magnet 35, and hence, shutter element 33. Similarly, magnetic material 35A with a permanent polarity is deposited on one end of shutter element 33A and is influenced by an adjacent magnetic material 36A which extends within electrical coil structure 37A.

The direction of the current running through electrical coil 37 determines the polarity of magnetic material 36, and therefore determines whether magnetic material 36 attracts or repels magnetic material 35. Conducting current through electrical coil 37 in a first direction causes the polarity of magnetic material 36 to be the same as that of magnetic material 35, thereby repelling magnetic material 35, and moving shutter element 33 to the position shown in FIG. 2 for blocking the related portion of aperture 30. In contrast, conducting current through electrical coil 37 in the opposite, second direction causes the polarity of magnetic material 36 to be the opposite to that of magnetic material 35, thereby attracting magnetic material 35, and moving shutter element 33 to its alternate position for exposing the related portion of aperture 30.

Similarly, the direction of the current running through electrical coil 37A determines the polarity of magnetic material 36A, and thereby determines whether magnetic material 36A attracts or repels magnetic material 35A. Conducting current through electrical coil 37A in the aforementioned second direction causes the polarity of magnetic material 36A to be the opposite that of magnetic material 35A, thereby attracting magnetic material 35A, and moving shutter element 33A to the position shown in FIG. 2 for exposing the related portion of aperture 30. In contrast, conducting current through electrical coil 37A in the aforementioned first direction causes the polarity of magnetic material 36A to be the same as that of magnetic material 35A, thereby repelling magnetic material 35A, and moving shutter element 33A to its alternate position for blocking the related portion of aperture 30.

Attraction of all shutter elements leaves aperture 30 completely open, allowing a continuous slit of light to be projected to the substrate to be exposed. Conversely, repulsion of all shutter elements causes aperture 30 to be completely blocked, allowing no light to pass. It will be appreciated that the electrical coils, including 37 and 37A, serve as actuators, each cooperating with a related one of the shutter elements for selectively moving its related shutter element between its first position and its second position. Magnetic shielding 38 should be used to isolate one coil structure 37 from the next, thereby preventing electromagnetic coupling between two adjacent coils.

The width of aperture 30 is generally equal to one pixel multiplied by the demagnification of the optics. If the optics demagnifies the image 10 times (i.e. 10×), and if the desired pixel size is 0.5 microns, then the width of aperture 30 would be 5.0 microns. The width of the slit forming aperture is determined by the field size desired multiplied by the demagnification factor. The field size should be a multiple of the pixel size. If a field size of 1,000 microns is desired with a demagnification of 10×, then a 10,000 microns-wide slit aperture is required.

Figure 3A:
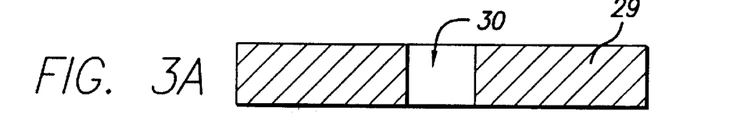
FIG. 3A is a cross-sectional drawing of an aperture formed in a semiconductor wafer.
Figure 3B:
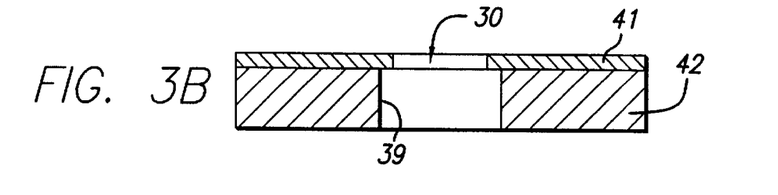
FIG. 3B is a cross-sectional drawing similar to that shown in FIG. 3A but wherein the dimensions of the aperture are determined by an additional layer of material disposed upon the semiconductor wafer.

Referring to FIG. 3A, slit aperture 30 may be made by etching though substrate 29, which may again be formed from a simple silicon wafer. Alternatively, as shown in FIG. 3B, an additional layer 41, which is placed on top of silicon substrate 42, may be used to define the size of aperture 30, thereby allowing the aperture 39 etched within silicon substrate 42 to be somewhat oversized. The composition and thickness of this additional layer 41 may be chosen to allow approximately 10% transmission and a 180 degree phase change of the light. This will provide a phase shift effect as described by Watanabe. Therefore, the composition and thickness of layer 41 is necessarily dependent upon the wavelength of light used.

Figures 4, 5:
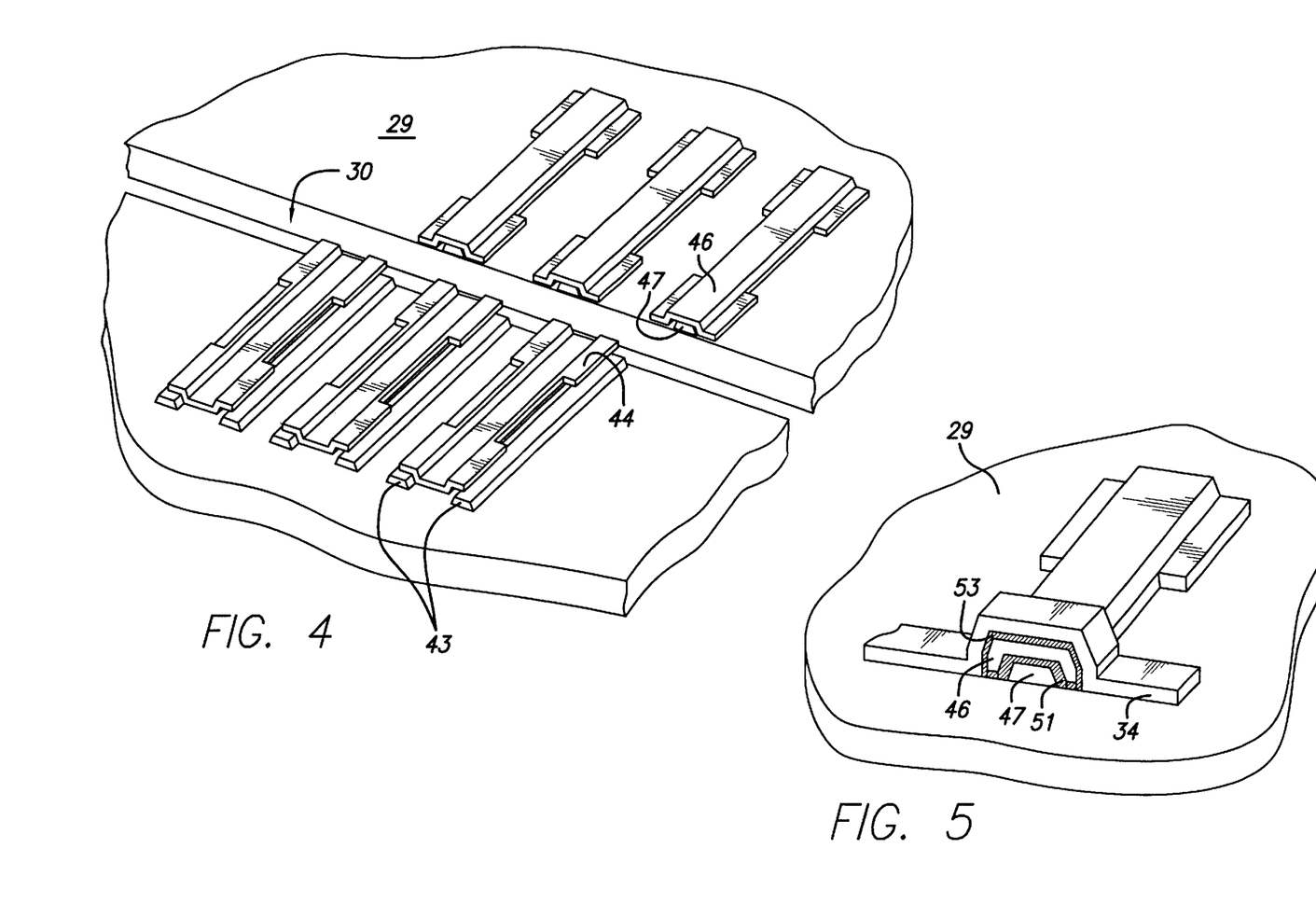
FIG. 4 is a perspective view of a series of shutter elements positioned on both sides of a slit aperture formed in the substrate.
FIG. 5 is a perspective view of a shutter element and showing guides for guiding movement of the shutter element, as well as sacrificial layers used in manufacturing such shutter elements.

In order to ensure smooth linear motion of the shutter elements, aperture assembly 24 preferably includes a series of guides secured to substrate 29 for guiding the movement of the shutter elements. Referring to FIG. 4, shutter element 44 slides back and forth along a pair of guides 43 that extend below, and along opposite edges of, shutter 44, and which allow only back and forth movement of shutter 44. Guides 43 may be formed of silicon that is deposited upon substrate 29. Formation of shutter element 44 on top of guides 43 provides shutter 44 with a topography that enhances the strength of shutter 44.

Likewise, shutter 46 on the opposite side of elongated aperture 30 is formed upon a single, central underlying guide 47. Guide 47 again limits travel of shutter 46 to back and forth movement. Guide 47 can again be formed from silicon deposited upon substrate 29. It will be noted in FIG. 4 that shutter element 44 is generally V-shaped in cross-section, while shutter element 46 generally forms an inverted V-shape in cross-section. This allows shutters 44 and 46 to move into their extended (blocking) positions across aperture 30 without making contact with, or otherwise interfering with, the adjacent shutters coming from the opposite side of aperture 30. Shutter elements 44 and 46 must be sufficiently long to extend fully across aperture 30 in order to selectively block light from passing through their respective portions of aperture 30. Preferably, guides 43 and 46 are of approximately the same length as shutter elements 44 and 46, respectively.

Shutter elements 33, 33A, and 33B (see FIG. 2) and 44 and 46 (see FIG. 4) can be formed of semiconductor material, such as silicon that is deposited onto silicon substrate 29. More details regarding the process used to deposit and pattern such shutter elements are provided below. At this point in the description, it might be mentioned that such shutter elements can be formed from a layer of material, such as a deposited layer of silicon, that was initially secured to the underlying substrate, and which is subsequently patterned and etched to form such shutter elements. Other opaque materials such as tantalum or aluminum can be used to enhance the silicon shutters; alternatively, such metals can be used instead of silicon to form such shutter elements. Once again, such shutter elements can be formed from a layer of metal that was initially deposited upon the substrate, and which is subsequently patterned and etched to form the shutter elements.

The width of each shutter element is equal to the desired pixel size times the demagnification of the optics. In other words, referring to FIG. 1, if the length of the image projected onto substrate 27 by reduction lens 25 is, for example, one-tenth of the length of aperture assembly 24, then the width of each shutter element is ten times the desired pixel width of the demagnified beam that strikes substrate 27. The MEMS shutter elements may be made to essentially block the transmission of all light, or as described above, to allow approximately 10% transmission and a 180-degree phase change of the light for the described phase shift effect.

Referring now to FIG. 5, the shutter elements can be built up from substrate 29 using sacrificial oxide or nitride layers which are removed later in the manufacturing process to allow each shutter element to slide freely. First, the silicon guides 43, 47 are formed upon substrate 29, as by depositing or growing a layer of silicon upon substrate 29, and then patterning such layer to etch away all portions of such layer except those forming guides 43, 47. The upper surface of substrate 29 is then covered with a thin sacrificial layer of silicon nitride 51, which bridges over the patterned guides 43, 47, as shown in FIG. 5. Next, a second layer of silicon, designated in FIG. 5 by reference numeral 46, is deposited over the nitride layer 51 to ultimately form the silicon shutter elements. This second layer of silicon is then patterned and etched to form individual shutter elements, such as shutter element 46.

Still referring to FIG. 5, the substrate is then covered by a second thin sacrificial layer 53 of silicon nitride. A third layer of silicon is then deposited over second sacrificial nitride layer 53; this third layer of silicon is then patterned and etched to form the silicon retaining bridge 34 that extends above each of the shutters elements. Finally, the sacrificial silicon nitride layers 51 and 53 are selectively etched away to free shutter element 46 from substrate 29, guide 47 and bridge 34, thereby allowing free sliding movement of shutter 46 relative thereto.

Figure 6A:
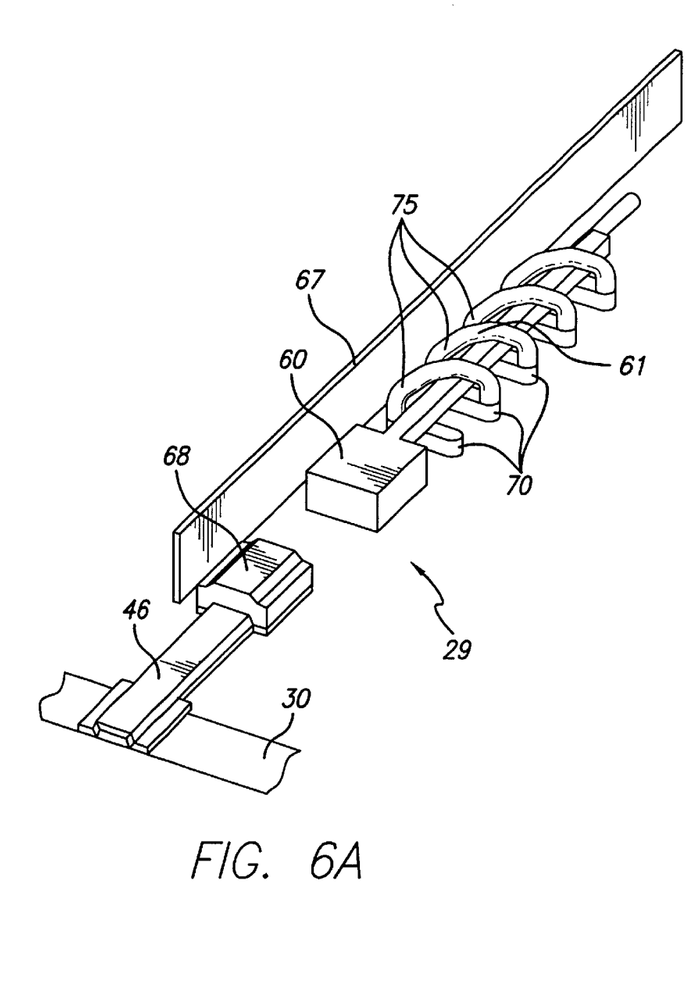
FIG. 6A is a perspective view of a shutter element being repelled by an associated electromagnet to cover a portion of the aperture.
Figure 6B:
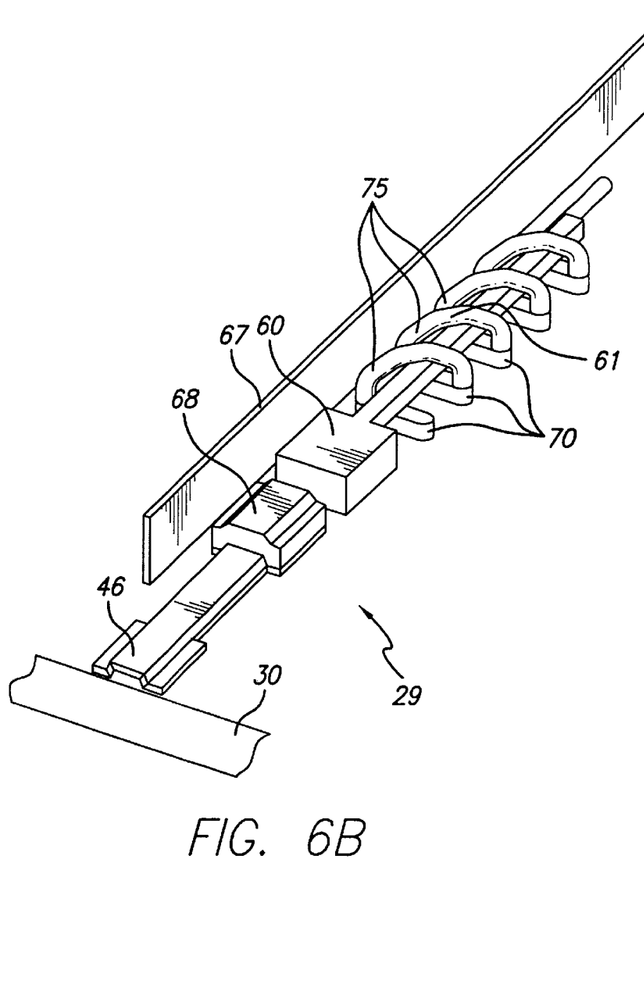
FIG. 6B is a perspective view of the shutter element shown in FIG. 6A, but being attracted by its associated electromagnet to expose a portion of the aperture.

As mentioned above, a magnetic material such as NiFe is deposited on top of one end of each shutter element with a permanent polarity in the same axis as the shutter movement, thus forming a permanent magnet on the end of the shutter element. Referring to FIGS. 6A & 6B, the polarity of the permanent magnet 68 is influenced by an adjacent non-movable magnet 60, which is surrounded by an electromagnetic coil 61 that extends along a longitudinal axis that is essentially colinear with non-movable magnet 60 and colinear with the sliding motion of shutter element 46. The coil configuration is such that as electrical current is moved through the coil in a first direction (see FIG. 6A), the non-movable magnet 68 is polarized to repel the adjacent shutter 46, thereby extending it over a portion of aperture 30, and therefore blocking the passage of light therethrough. When the current is reversed in coil 61 (see FIG. 6B), the polarity of non-movable magnet 60 reverses, attracting the shutter 46 and pulling it away from the aperture 30, thereby allowing the light to pass through the selected portion of aperture 30. Magnetic shielding 67, such as NiFe or other soft magnetic material, is interposed between adjacent coils to isolate each of the electrical coil assemblies so that the operation of one assembly does not interfere with the operation of the adjacent assemblies.

Figure 7:
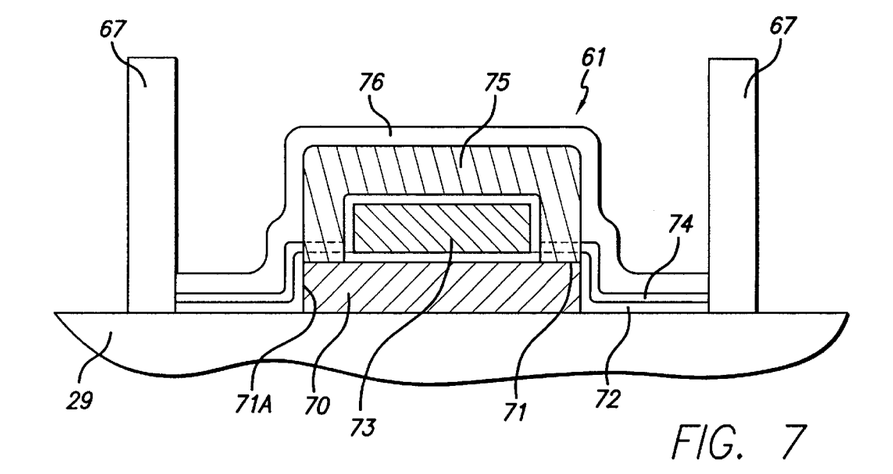
FIG. 7 is a cross-sectional drawing of an electrical coil assembly including stationary magnetic material disposed within such coil, insulating material, and magnetic shielding material separating adjacent electrical coils.

FIG. 7 illustrates the manner by which electrical coil 61 of FIGS. 6A/6B is produced. Initially, a first layer 70 of aluminum or other metal is deposited upon substrate 29; this first layer 70 of metal is then patterned and etched to form the lower rungs of electrical coil 61, as well as the lower rungs of the other electrical coils to be formed on substrate 29. As shown in FIGS. 6A/6B and FIG. 7, each of the lower rungs 70 of electrical coil 61 extend generally perpendicular to the longitudinal axis of electrical coil 61. In addition, each such lower rung has a first end 71 and an opposing second end 71A. After patterning the lower rungs 70, substrate 29 is then covered with an insulating material 72, such as silicon dioxide, which extends over substrate 29 and over the patterned lower rungs 70. Magnetic material 73 is then deposited above first insulative layer 72 and above, and perpendicular to lower rungs 70, along the longitudinal axis of electrical coil 61; this magnetic material may again consist of NiFe, extends and ultimately forms the non-movable magnet 60. Another encapsulating insulating layer of material 74 is deposited over substrate 29, covering first insulative layer 72 and magnetic material 73. Holes are then etched through the first insulative layer 72 and second insulative layer 74 above the first and second opposing ends 71 and 71A, respectively, of each lower rung to expose such ends. A further metal layer 75 is then deposited over substrate 29, covering second insulative layer 74, but extending within the aforementioned etched holes. This second metal layer 75 is then patterned to form the diagonal connecting arms 75 shown in FIGS. 6A/6B and FIG. 7, in order to connect the first end of one lower rung to the second end of the next succeeding lower rung, thereby forming electrical coil 61. Finally, a third insulative layer of material 76 is deposited over the substrate and entire coil assembly to insulate the diagonal connecting arms 75 of the electrical coils, such as coil 61.

As mentioned above, it is desirable to isolate adjacent electrical coils from each other by disposing magnetic shield material between such coils. As shown in FIG. 7, magnetic shielding material 67 is deposited along both sides of electrical coil 61, but spaced apart therefrom, to isolate each such electrical coil 61 from its adjacent neighboring coils.

Figure 8:
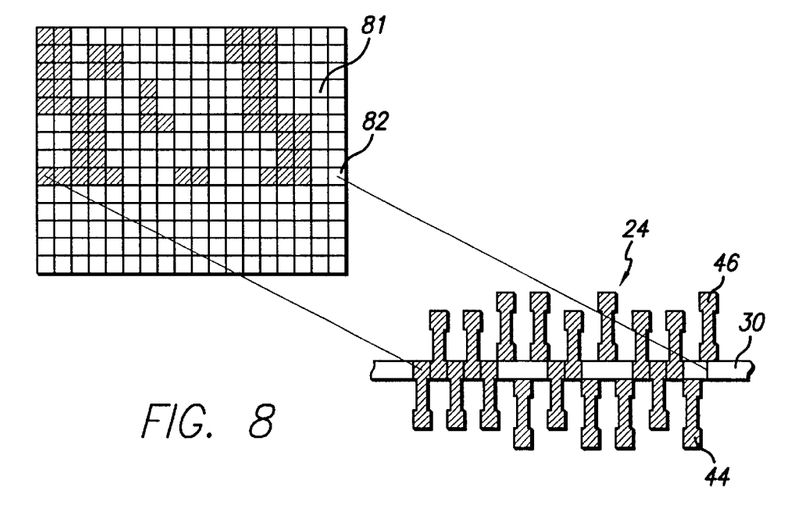
FIG. 8 is a top view of the photosensitive work surface to be exposed, broken into portions, and showing the configuration of shutter elements used to form the pattern to expose one of such portions.

Referring to FIGS. 1 and 8, the image resulting from the light passing through the slit aperture assembly 24 is projected to scanning mirror 26 which reflects the image to the substrate 27 to be exposed. As scanning mirror 26 is rotated, the shutter elements described above, including shutter elements 44 and 46, move in such a way over aperture 30 as to create the two dimensional image 81 shown in FIG. 8. Within FIG. 8, the image shown in the row designated 82 corresponds to the pattern of shutter elements covering or exposing aperture 30.

Figure 9A:
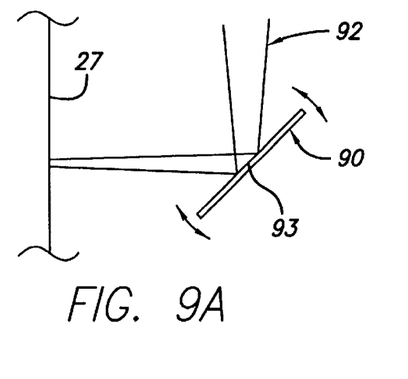
FIG. 9A is a schematic drawing showing the use of a planar scanning mirror for stepping the patterned light beam onto a corresponding portion of the photosensitive work surface to be exposed.
Figure 9B:
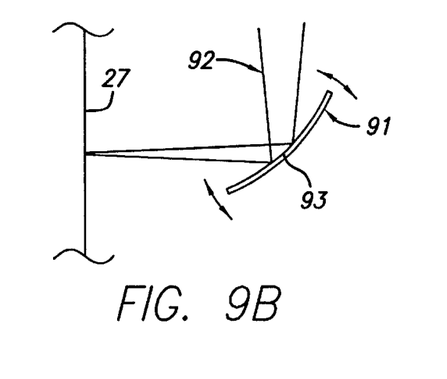
FIG. 9B is a schematic drawing similar to FIG. 9A but showing the use of a concave scanning mirror for stepping the patterned light beam onto a corresponding portion of the photosensitive work surface to be exposed.

Referring to FIG. 9A, flat scanning mirror 90 must rotate about the reflective plane 93 to limit scan distortions. On the other hand, the one-dimensional concave scanning mirror 91 shown in FIG. 9b offers several benefits over the flat scanning mirror 90 shown in FIG. 9A. First, by further focusing the incoming patterned beam of light 92 in one dimension, the intensity is increased allowing for higher doses of exposure and/or throughput. Second, because the projected image is less than one pixel wide, the shutter movement can be more precisely controlled reducing exposure gradients at the edge of features.

As mentioned above with respect to FIG. 1, an alternative to the use of a scanning mirror is to project the image directly to the substrate 27, and to move the stage which supports substrate 27 by incremental, indexed movements, to effectively scan the entire photosenstive surface of substrate 27 through the stationary image. Each time the substrate supporting stage is advanced, the shutter elements are moved to form a new patterend beam of light. The combination of stage indexing and shutter movements creates a two-dimensional image upon substrate 27, similar to that shown in FIG. 8. The precisely controlled substrate support stage must be synchronized with the shutter movement.

Several exposure techniques can be use to enhance the image quality. First, the scan rate can be adjusted to vary the exposure dose in a desired area on the substrate. Second, a retrace scan can be used to re-expose all or part of a given exposure. This will allow portions of a given pattern to be exposed at a different dose or doses than the bulk of the pattern. Third, optical proximity corrections as described in Glendinning can be used by simply correcting the pattern data file in a computer.

Apart from the new and improved maskless exposure apparatus described above, the present invention also encompasses a new method for exposing a photosensitive surface to a desired light pattern. In practicing such method, a substrate is provided like described substrate 29, including an elongated aperture 24/30. A beam of light, such as that produced by light source 22 and mirror 21 is directed generally toward the elongated aperture 24/30. A series of shutter elements 33, 33A, 33B are supported upon the substrate 29, each of the shutter elements being movable between a first position covering a portion of the elongated aperture, as indicated for example by FIG. 6A, and a second position exposing a portion of the elongated aperture, as indicated by FIG. 6B. Such shutter elements extend generally parallel to the plane of the substrate, whether in the first position or second position, and movement of such shutter elements is a generally linear sliding motion.

To control the pattern of light emitted by the aperture 24/30, the method includes the step of moving each of the shutter elements to either its first position (FIG. 6A) or its second position (FIG. 6B) to selectively block or pass portions of the beam of light, thereby creating a first patterned light beam exiting the elongated aperture 24/30 of the substrate 29. This first patterned light beam is directed upon a first portion of the photosensitive work surface of a work material, such as a photoresist coating applied to substrate 27. The steps of moving each of the shutter elements to either its first position or its second position is repeated in a subsequent exposure cycle to create a second patterned light beam exiting the elongated aperture 24/30. The second patterned light beam is then directed upon a second portion of the photosensitive work surface. These steps are repeated for third and subsequent portions of the photosensitive work surface, as indicated in FIG. 8, until substantially all portions of the photosensitive work surface have been exposed to a respective patterned light beam.

Those skilled in the art will now appreciate that the present invention provides an apparatus and method for eliminating the need for conventional photolithography masks. The single narrow slit aperture, combined with the series of micro electromechanical system, or MEMS, shutter elements creates desired patterns of light. The shutter elements are positioned in such a way as to allow portions of the slit aperture to be selectively covered, therefore blocking the light transmission. The resulting image projected onto the substrate is a row of pixels with only the desired pixels illuminated. The projected image is then advanced to the next row on the substrate, and the shutter elements are reconfigured to produce the desired light pattern. This process is repeated until all of the rows of the target substrate have been selectively exposed. The described shutter elements slide back and forth without contact while still blocking the path of the light.

Those skilled in the art will also appreciate that the maskless exposure system and related method described above can be used with any appropriate wavelength of light, including DUV and EUV, because the desired light rays do not travel through any solid medium, as is true for chrome-on-quartz masks. Further, the above-described apparatus and method can be used at any of the common magnifications, including 1×, 5× or 10×. In addition, because the shutter elements and related electromagnet actuators are so small, the aperture assembly reduces to a very dense structure. In addition, the use of the electromagnetic coils to actuate the shutter elements magnetically allows the size of the shutter elements and the size of the electrical coil to be more independent of each other; the coil can be as long as necessary to move the shutter element without affecting the size of the shutter element itself. All movement is positively induced by magnetic forces, and no spring mechanisms or other attached devices are required to return the shutter elements to their initial position.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

I claim:

1. A maskless exposure system for selectively exposing a work material having a photosensitive work surface to light, said maskless exposure system comprising in combination:
   a. a substrate having an elongated aperture formed therein, said substrate generally lying in a plane;
   b. a source of a light beam directed generally toward the elongated aperture;
   c. a plurality of shutter elements movably supported upon said substrate, each of said shutter elements having a first position covering a portion of the elongated aperture and preventing the passage of light through such portion, and each of said shutter elements having a second position exposing a portion of the elongated aperture for allowing the passage of light through such portion, each of said plurality of shutter elements extending generally parallel to the plane of said substrate, said plurality of shutter elements creating a patterned light beam exiting the elongated aperture of said substrate;
   d. a plurality of actuators, each of said actuators cooperating with a related one of said plurality of shutter elements for selectively moving said related shutter element between its first position and its second position;
   e. a work material support for supporting a work material having a photosensitive work surface; and
   f. a stepper for adjusting the relationship between the patterned light beam exiting the elongated aperture of said substrate and the work material support in order to direct the patterned light beam at different portions of the photosensitive work surface of the work material.

2. The maskless exposure system recited by claim 1 wherein said substrate is formed of a predetermined semiconductor material, and wherein said plurality of shutter elements are formed from a layer of material that was once secured to said substrate.

3. The maskless exposure system recited by claim 2 wherein said plurality of shutter elements are formed from of semiconductor material.

4. The maskless exposure system recited by claim 2 wherein said plurality of shutter elements are formed from a layer of metal deposited upon said substrate.

5. The maskless exposure system recited by claim 1 wherein each of said plurality of shutter elements slides in a linear motion between its first and second positions.

6. The maskless exposure system recited by claim 5 including a plurality of guides secured to said substrate, each of said guides extending about one of said plurality of shutter elements for guiding movement of said shutter element.

7. The maskless exposure system recited by claim 5 wherein said plurality of shutter elements includes a first shutter element and a second shutter element, the first shutter element and the second shutter element each having a side edge, and wherein the side edge of the first shutter element extends closely proximate the side edge of the second shutter element when both the first and second shutter elements are in the first position covering a portion of the elongated aperture.

8. The maskless exposure system recited by claim 7 wherein said first and second shutter elements lie on opposite sides of the elongated aperture.

9. The maskless exposure system recited by claim 1 wherein each of said plurality of shutter elements incorporates a small permanent magnet, and wherein each of said plurality of actuators includes an electromagnet in the form of a coiled electrical conductor for repelling or attracting a related one of said plurality of shutter elements.

10. The maskless exposure system recited by claim 9 wherein said plurality of actuators includes first and second actuators, and including magnetic shielding interposed between said first and second actuators.

* * * * *